(12) United States Patent
Poon et al.

(10) Patent No.: US 12,160,256 B2
(45) Date of Patent: Dec. 3, 2024

(54) DAC-BASED TRANSMIT DRIVER ARCHITECTURE WITH IMPROVED BANDWIDTH

(71) Applicant: XILINX, INC., San Jose, CA (US)

(72) Inventors: Chi Fung Poon, Sunnyvale, CA (US); Chuen-Huei Chou, San Jose, CA (US); Weerachai Neeranartvong, San Jose, CA (US); Kevin Zheng, San Jose, CA (US)

(73) Assignee: XILINX, INC., San Jose, CA (US)

( * ) Notice: Subject to any disclaimer, the term of this patent is extended or adjusted under 35 U.S.C. 154(b) by 363 days.

(21) Appl. No.: 17/559,592

(22) Filed: Dec. 22, 2021

(65) Prior Publication Data
US 2023/0198562 A1 Jun. 22, 2023

(51) Int. Cl.
*H04B 1/04* (2006.01)
*H03M 1/66* (2006.01)
*H03M 1/74* (2006.01)

(52) U.S. Cl.
CPC .......... *H04B 1/0483* (2013.01); *H03M 1/662* (2013.01); *H03M 1/74* (2013.01)

(58) Field of Classification Search
CPC ...... H04B 1/0483; H03M 1/662; H03M 1/74; H03M 9/00; H03M 1/742; H03M 1/785; H03M 1/00–02; H03M 1/66–88; H03F 3/45475; H03F 3/45179; H03K 17/6872; H03K 17/6874; H03L 7/00; G06F 13/4291; G06F 1/10; G06F 1/06
See application file for complete search history.

(56) References Cited

U.S. PATENT DOCUMENTS

| | | | |
|---|---|---|---|
| 6,538,499 B1 | 3/2003 | Lu | |
| 6,603,331 B1 | 8/2003 | Om'Mani et al. | |
| 6,611,218 B1 | 8/2003 | Lu et al. | |
| 6,842,041 B1 | 1/2005 | Om'Mani et al. | |
| 7,313,373 B1 | 12/2007 | Laskharian et al. | |
| 8,436,642 B1 | 5/2013 | Kireev et al. | |
| 8,446,173 B1* | 5/2013 | Faucher | H03K 19/017509 326/86 |
| 8,604,838 B2* | 12/2013 | Payne | H03K 5/249 327/54 |
| 8,654,823 B1 | 2/2014 | Zhu et al. | |

(Continued)

OTHER PUBLICATIONS

Choi, M. et al., "8 An Output-Bandwidth-Optimized 200Gb/s PAM-4 100Gb/s NRZ Transmitter with 5-Tap FFE in 28nm CMOS," 2021 IEEE International Solid-State Circuits Conference (ISSCC), 2021, pp. 128-130.

(Continued)

*Primary Examiner* — Jinsong Hu
*Assistant Examiner* — Rui M Hu
(74) *Attorney, Agent, or Firm* — Patterson + Sheridan, LLP

(57) ABSTRACT

A DAC-based transmit driver architecture with improved bandwidth and techniques for driving data using such an architecture. One example transmit driver circuit generally includes an output node and a plurality of digital-to-analog converter (DAC) slices. Each DAC slice has an output coupled to the output node of the transmit driver circuit and includes a bias transistor having a drain coupled to the output of the DAC slice and a multiplexer having a plurality of inputs and an output coupled to a source of the bias transistor.

20 Claims, 6 Drawing Sheets

(56) References Cited

U.S. PATENT DOCUMENTS

| | | | |
|---|---|---|---|
| 9,419,636 B1* | 8/2016 | Graham | H03M 1/0836 |
| 9,674,015 B2 | 6/2017 | Kireev et al. | |
| 9,712,257 B1 | 7/2017 | Tan et al. | |
| 9,742,498 B1* | 8/2017 | Nagarajan | H04B 10/524 |
| 9,806,729 B1* | 10/2017 | Razzaghi | H03M 1/0612 |
| 9,832,048 B2 | 11/2017 | Kireev | |
| 9,841,455 B2 | 12/2017 | McLeod et al. | |
| 9,954,630 B1 | 4/2018 | Venna | |
| 10,096,964 B1* | 10/2018 | Abdelhalim | H01S 3/0912 |
| 10,348,290 B1 | 7/2019 | Zhang et al. | |
| 10,491,436 B1 | 11/2019 | Lim et al. | |
| 10,554,449 B1* | 2/2020 | Ghittori | H04L 25/03057 |
| 10,819,365 B1* | 10/2020 | Nguyen | H03M 3/346 |
| 10,862,500 B1* | 12/2020 | Pelliconi | H03M 1/66 |
| 11,139,843 B1* | 10/2021 | Li | H03K 19/018521 |
| 11,196,418 B1 | 12/2021 | Suryanarayana et al. | |
| 2004/0116160 A1* | 6/2004 | Deas | H04L 25/085 |
| | | | 375/220 |
| 2005/0271136 A1* | 12/2005 | Chung | H04L 25/03146 |
| | | | 375/233 |
| 2006/0092062 A1* | 5/2006 | Pan | H03K 19/1738 |
| | | | 341/144 |
| 2008/0267212 A1* | 10/2008 | Crawley | H05K 9/0066 |
| | | | 370/463 |
| 2008/0272952 A1* | 11/2008 | Wood | G04F 10/005 |
| | | | 341/166 |
| 2010/0283642 A1* | 11/2010 | Lai | H03M 1/1061 |
| | | | 341/120 |
| 2012/0201289 A1* | 8/2012 | Abdalla | H04L 25/0272 |
| | | | 375/232 |
| 2013/0002301 A1* | 1/2013 | Gondi | H03K 19/018557 |
| | | | 326/82 |
| 2015/0222287 A1* | 8/2015 | Tekin | H04L 7/02 |
| | | | 341/110 |
| 2015/0269112 A1* | 9/2015 | Hsueh | G06F 13/4072 |
| | | | 710/105 |
| 2015/0304134 A1* | 10/2015 | Hafizi | H04L 7/0091 |
| | | | 375/257 |
| 2016/0209462 A1* | 7/2016 | Choi | H04B 3/46 |
| 2018/0191363 A1* | 7/2018 | Li | H03M 1/406 |
| 2019/0004561 A1* | 1/2019 | Ho | H03M 1/66 |
| 2022/0147482 A1* | 5/2022 | Kim | H03K 17/6872 |
| 2022/0368337 A1* | 11/2022 | Cho | H03M 1/0617 |
| 2023/0152165 A1* | 5/2023 | Singh | G01K 13/00 |
| | | | 374/163 |
| 2023/0170914 A1* | 6/2023 | Maccarrone | H03M 1/089 |
| | | | 341/118 |
| 2023/0188388 A1* | 6/2023 | Valaee | H04L 25/03057 |
| | | | 327/90 |
| 2023/0361783 A1* | 11/2023 | Sakata | H03M 1/745 |

OTHER PUBLICATIONS

Chan, K. L. et al., "A 32.75-Gb/s Voltage-Mode Transmitter With Three-Tap FFE in 16-nm CMOS," in IEEE Journal of Solid-State Circuits, vol. 52, No. 10, pp. 2663-2678, Oct. 2017.

Tan, K. et al., "A 112-GB/S PAM4 Transmitter in 16NM FinFET," 2018 IEEE Symposium on VLSI Circuits, 2018, pp. 45-46.

* cited by examiner

500

502

SELECTIVELY ENABLE A PLURALITY OF DIGITAL-TO-ANALOG CONVERTER (DAC) SLICES OF A TRANSMIT DRIVER CIRCUIT

THE PLURALITY OF DAC SLICES CORRESPOND TO DIFFERENT CURRENT VALUES

THE SELECTIVE ENABLING STEERS A CORRESPONDING CURRENT FROM ENABLED DAC SLICES TO THE OUTPUT NODE OF THE TRANSMIT DRIVER CIRCUIT

504

ACTIVATE AN ACTIVE INDUCTOR IN EACH DAC SLICE, THE ACTIVE INDUCTOR HAVING A TERMINAL COUPLED TO THE OUTPUT OF THE MULTIPLEXER IN EACH DAC SLICE

506

DRIVE THE PLURALITY OF CONTROL INPUTS OF THE MULTIPLEXER IN EACH DAC SLICE WITH A PULSE GENERATOR IN EACH DAC SLICE

508

BIAS THE BIAS TRANSISTORS OF THE PLURALITY OF DAC SLICES WITH A PLURALITY OF BIAS DAC CIRCUITS

FIG. 5

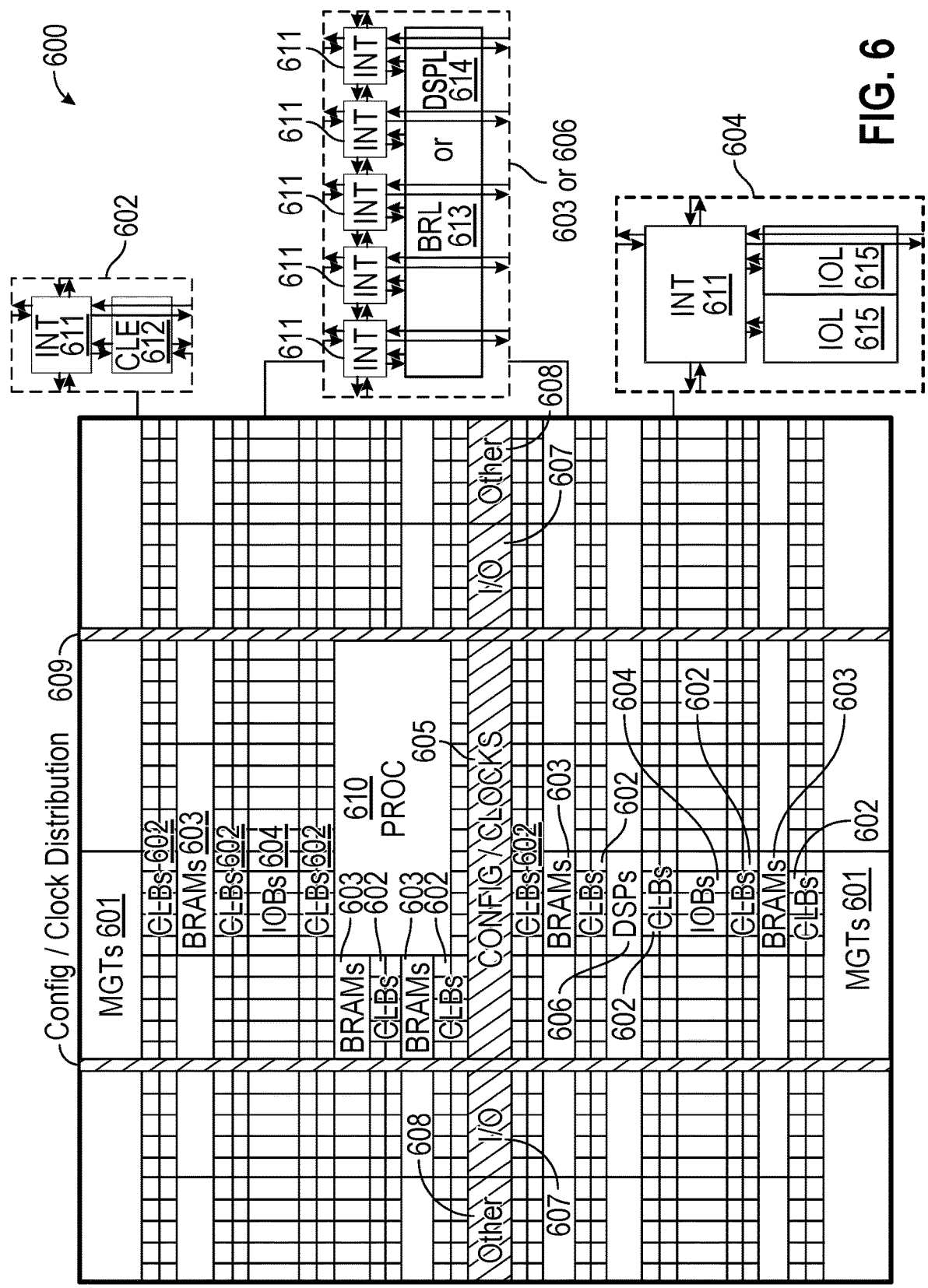

DAC-BASED TRANSMIT DRIVER ARCHITECTURE WITH IMPROVED BANDWIDTH

TECHNICAL FIELD

Examples of the present disclosure generally relate to electronic circuits and, more particularly, to a transmit driver circuit.

BACKGROUND

The use of high-speed serial communication links in electronic systems has continued to grow. In certain cases, serial links may be used for inter-integrated circuit (IC) communications within an electrical device (e.g., a serial bus between memory and a processing system) and/or between electrical devices (e.g., serial bus between a computer and a wearable device). In other cases, serial links may be used for inter-circuit communications within a system-on-a-chip (SoC). High-speed serial communication finks can operate according to various standards such as Universal Serial Bus (USB), High-Definition Multimedia Interface (HOMO, Serial Advanced Technology Attachment (SATA), and Peripheral Component Interconnect Express (PCIe) interfaces. A serializer/deserializer (SerDes) may be used to transmit and receive data via a serial communication link. A SerDes transmitter serializes a multi-bit word into a serial data stream of corresponding bits. A SerDes receiver deserializes the received serial data stream into the original multi-bit word. In some SerDes systems, a dock signal is transmitted along with the serial data stream, whereas in other SerDes systems, the clock signal is instead embedded in the serial data stream.

SUMMARY

Certain aspects of the present disclosure generally relate to a digital-to-analog converter (DAC)-based transmit driver architecture, such as for a serializer/deserializer (SerDes) transmitter.

Certain aspects of the present disclosure provide a transmit driver circuit. The transmit driver circuit generally includes an output node and a plurality of digital-to-analog converter (DAC) slices. Each DAC slice generally includes an output coupled to the output node of the transmit driver circuit, a bias transistor having a drain coupled to the output of the DAC slice, and a multiplexer having a plurality of control inputs and an output coupled to a source of the bias transistor.

Certain aspects of the present disclosure provide a programmable integrated circuit (IC) comprising a transmitter of a serializer/deserializer link, wherein the transmitter comprises the transmit driver circuit described herein.

Certain aspects of the present disclosure provide a method of driving data. The method generally includes selectively enabling a plurality of DAC slices of a transmit driver circuit, each DAC slice having an output coupled to an output node of the transmit driver circuit. Each DAC slice generally includes a bias transistor having a drain coupled to the output of the DAC slice; and a multiplexer having a plurality of control inputs and an output coupled to a source of the bias transistor, wherein the plurality of DAC slices correspond to different current values and wherein the selectively enabling steers a corresponding current from enabled DAC slices to the output node of the transmit driver circuit.

These and other aspects may be understood with reference to the following detailed description.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of the scope of the claims.

FIG. 5 is a flow diagram of example operations for driving data, according to certain aspects of the present disclosure.

FIG. 6 is a block diagram illustrating an example architecture for a programmable device, in which aspects of the present disclosure may be practiced.

To facilitate understanding, identical reference numerals have been used, where possible, to designate identical elements that are common to the figures. It is contemplated that elements of one example may be beneficially incorporated in other examples without specific recitation.

DETAILED DESCRIPTION

Figure 1:
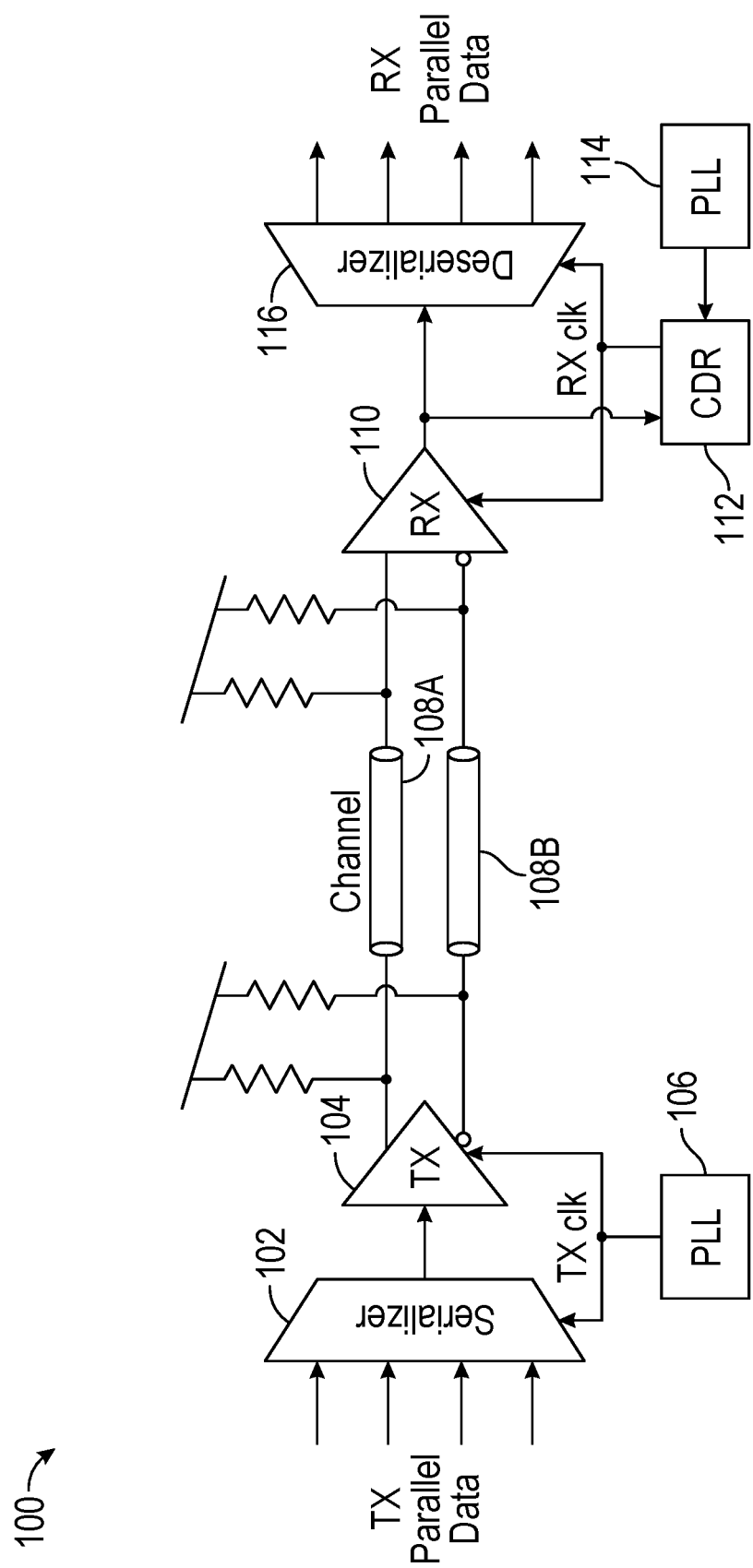
FIG. 1 is a block diagram of an example serializer/deserializer (SerDes) circuit having a SerDes transmitter and a SerDes receiver, in which aspects of the present disclosure may be practiced.

Examples of the present disclosure generally relate to a DAC-based transmit driver architecture with improved bandwidth, such as for a serializer/deserializer (SerDes) transmitter. The transmit driver architecture may have multiple DAC slices, in which a single bias transistor in each DAC slice is coupled between an output of a final multiplexing stage of the DAC slice and the output of the transmit driver (the output PAD). In some examples, the transmit driver architecture may further include an active inductor in each DAC slice, coupled to the output of the final multiplexing stage in each DAC slice to further improve the bandwidth and reduce the common-mode ripple at the output of the transmit driver.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. The figures are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Example SerDes Circuit

FIG. 1 is a block diagram of an example SerDes circuit 100, in which aspects of the present disclosure may be practiced. As shown, the SerDes circuit 100 may include a serializer 102, a SerDes transmitter 104 (labeled "TX"), a phase-locked loop (PLL) 106 for providing a transmit clock, a differential pair of serial channels 108A, 108B, a SerDes receiver 110 (labeled "RX"), a clock data recovery (CDR) circuit 112, a PLL 114 on the receive side, and a deserializer 116.

The serializer 102 converts data received on a parallel interface to a serial interface and provides a signal (e.g., a bitstream) of the serial data to the SerDes transmitter 104. The SerDes transmitter 104 may include a driver, which may amplify the serial data signal and output a differential signal on the serial channels 108A, 108B, The driver may be implemented as a voltage-mode driver or as a current-mode logic (CML) driver. In certain aspects, the SerDes transmitter 104 may also perform equalization to improve signal integrity of the SerDes circuit 100, such as by compensating (or at least adjusting) for loss in the channels 108A, 108B. The differential signal output by the SerDes transmitter 104 may be a low-voltage differential signal (LVDS), for example. In certain aspects, the serial channel 108A may carry the non-inverted signal of the differential pair, and the serial channel 108B may carry the inverted signal (i.e., the complementary signal) of the differential pair. In certain aspects, the differential signal output by the SerDes transmitter 104 may be sampled and generated according to the transmit clock output by the PLL 106. The PLL 106 may be used, for example, as a clock-synthesizer circuit that generates a high-speed master clock used for the serial data transmission.

The SerDes receiver 110 receives the differential signal of the serial data on the serial channels 108A, 108B and may amplify the received differential signal. In certain aspects, the SerDes receiver 110 may perform equalization of the received differential signal, in addition to the equalization performed by the SerDes transmitter 104. The CDR circuit 112 is coupled to the output of the SerDes receiver 110 and performs the timing recovery to recover the master dock used to sample the signals and generate a receive clock at the SerDes receiver 110. In certain aspects, the CDR circuit 112 may receive a reference dock signal via the PLL 114. The deserializer 116 converts the serial signal output by the SerDes receiver 110 to parallel form.

Signal transmission speed has rapidly increased in recent years and will continue to increase. In response, a digital-to-analog converter (DAC)-based transmit driver architecture has become widely used because such an architecture provides flexibility and low overhead in channel equalization implementation with multi-level signaling schemes.

DAC-based transmit drivers may be said to have a fan-in nature because the transmit driver's data rate increases from the input to the output of the transmit driver. As a result of this fan-in nature, the frontend bandwidth demands of the transmit driver increase along with data throughput. Insufficient bandwidth may cause inter-symbol-interference (ISI) and degradation of bit error rate (BER). To compensate, or at least adjust, for this, transmit drivers may be designed to minimize, or at least reduce, the on-chip high-speed path by performing the final serialization at the output node (referred to as "PAD" for a conductive pad of an integrated circuit). However, this may result in increased PAD loading, which may be particularly undesirable in DAC-based transmit drivers. Accordingly, examples of the present disclosure provide a transmit driver architecture that has large bandwidth without increased PAD loading.

Example DAC-Based Transmit Driver Architecture with Improved Bandwidth

As mentioned above, some examples of the present disclosure provide a digital-to-analog converter (DAC)-based transmit driver circuit having multiple DAC slices, in which a single bias transistor in each DAC slice is coupled between an output of a multiplexing (MUXing) stage in each DAC slice and an output of the transmit driver circuit, thereby decreasing the loading on the output of the transmit driver circuit and improving driver bandwidth.

Figure 2:
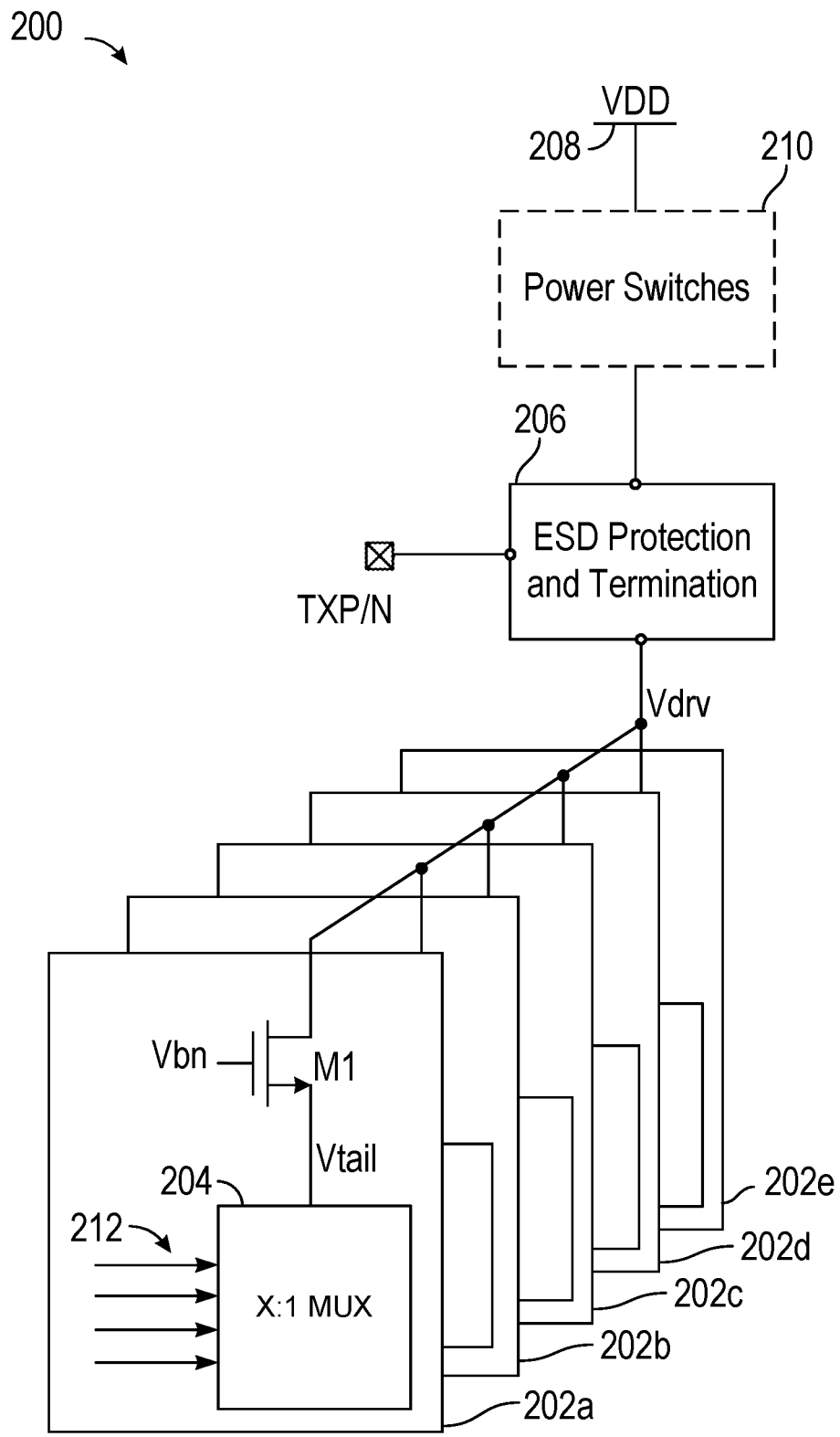
FIG. 2 is a block diagram of an example DAC-based transmit driver architecture, according to certain aspects of the present disclosure.

FIG. 2 is a block diagram of an example DAC-based transmit driver 200, according to certain aspects of the present disclosure. The transmit driver 200 may be used in a SerDes transmitter (e.g., SerDes transmitter 104) in a SerDes circuit (e.g., SerDes circuit 100). As illustrated in FIG. 2, the transmit driver 200 may include multiple DAC slices 202a-e, an electrostatic discharge (ESD) protection and termination circuit 206, a power supply rail 208, and optional power switches 210. Although five DAC slices 202a-e are illustrated in FIG. 2, the reader is to understand that the transmit driver circuit may include more or less than five DAC slices.

In some examples, an output of each of the DAC slices 202a-e may be coupled to an output (e.g., summing node Vdrv, a positive transmitter output node TXP, or a negative transmitter output node TXN of a differential transmit driver circuit) of the transmit driver 200. Each of the DAC slices 202a-e may have a MUXing stage 204 and a bias transistor M1 The bias transistor M1 may be an n-type transistor and may have a drain coupled to the output of the corresponding DAC slice (e.g., the DAC slice 202a) and a source coupled to the MUXing stage 204 (though node Vtail). A gate of the bias transistor M1 may be configured to receive a bias voltage (Vbn).

As depicted in FIG. 2, the MUXing stage 204 may generally include an X:1 multiplexer (MUX), which may operate to multiplex a plurality of control inputs 212 to selectively sink current through an output of the MUXing stage through node Vtail. An output of the MUXing stage 204 may be coupled to the source of the transistor M1. By having a single bias transistor in each DAC slice coupled between the output of the MUXing stage 204 and the summing node Vdrv, the PAD loading may be decreased, thereby increasing bandwidth compared to other designs having one bias transistor per branch of the MUX.

Figure 3:
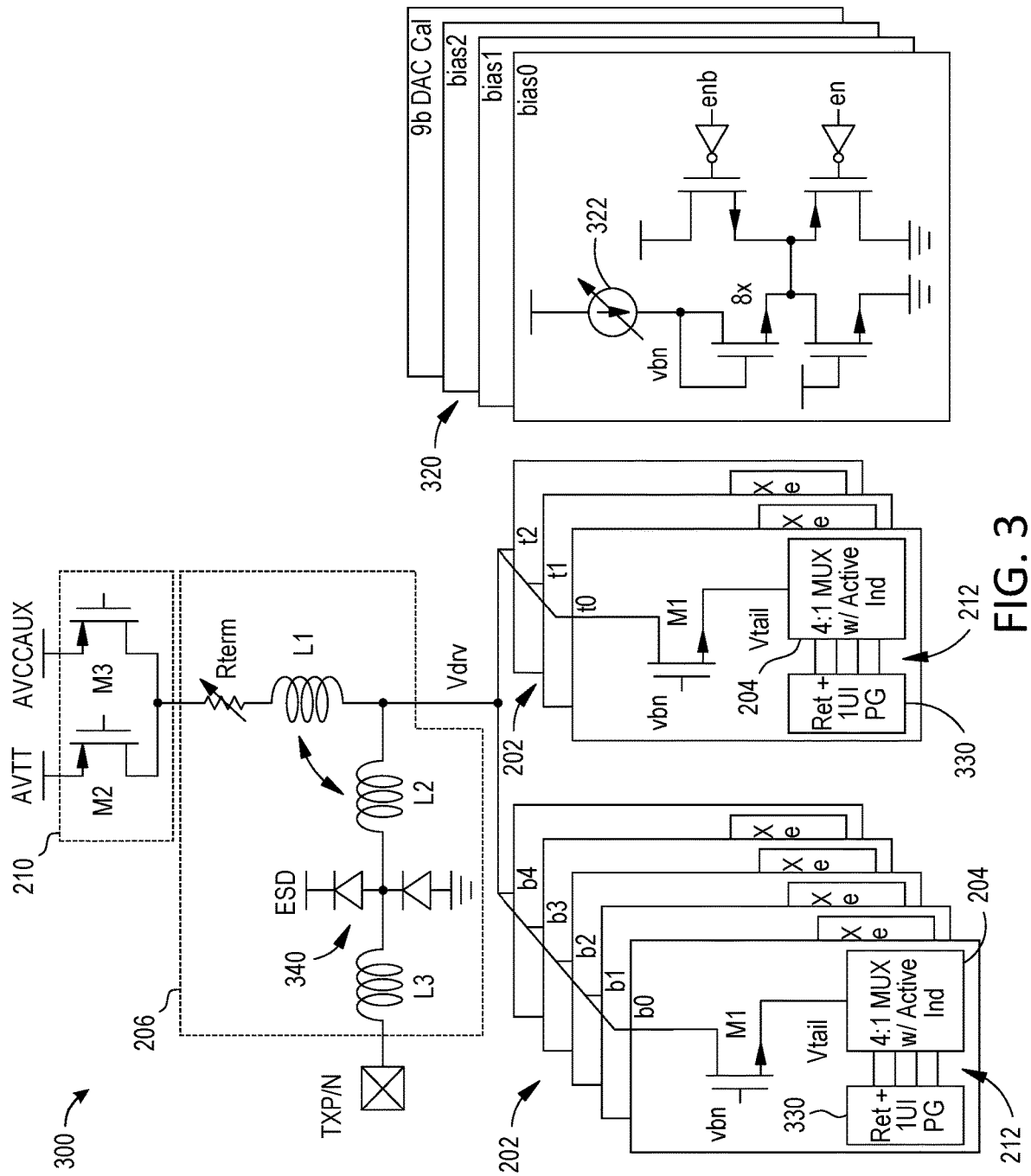
FIG. 3 is a circuit diagram illustrating additional components of an example DAC-based transmit driver circuit, according to certain aspects of the present disclosure.

FIG. 3 is a circuit diagram illustrating an example implementation of a DAC-based transmit driver circuit 300 with improved bandwidth, according to certain aspects of the present disclosure. The transmit driver circuit 300 has the topology of a tail-less current mode logic driver and is similar to the transmit driver 200 of FIG. 2, but with some additional circuitry. For example, transmit driver circuit 300 may include bias DAC circuits 320 and each DAC slice may include retimer and pulse generator circuits 330. Additionally, the MUXing stage 204 of each DAC slice 202 may be coupled to an active inductor circuit (discussed further with respect to FIG. 4). As shown in FIG. 3, the transmit driver circuit 300 may be a 7-bit transmit driver circuit, but the transmit driver circuit may be modified to operate with a different number of digital bits. To implement a 7-bt transmit driver circuit, as shown in FIG. 3, the plurality of DAC slices 202 may include five binary-weighted-bit DAC slices (labeled "b0," "b1," "b2," "b3," and "b4") and three thermometer-encoded DAC slices (labeled "t0," "t1," and "t2") for a 2-bit thermometer code.

Each of the bias DAC circuits 320 may generate a bias voltage (Vbn) for a corresponding DAC slice 202 and, thus, may be a replica of one of the plurality of DAC slices 202. For example, each of the bias DAC circuits 320 may include a tunable current source 322, a replica bias transistor (for replicating bias transistor M1), a replica MUXing stage (e.g., a replica multiplexer transistor), and a replica active inductor. An output of each of the bias DAC circuits 320 may be coupled to a gate of the bias transistor M1 in at least one of the DAC slices 202.

In the example of FIG. 3, the bias DAC circuits 320 may include a first bias DAC circuit (labeled "bias0") with an output coupled to gates of the bias transistors M1 for bits 0 and 1 in the binary-weighted-bit DAC slices (e.g., transistor M1 in DAC slices b0 and b1). The bias DAC circuits 320 may also include a second bias DAC circuit (labeled "bias1" in FIG. 3) with an output coupled to a gate of the bias transistor for bit 2 in the binary-weighted-bit DAC slices (e.g., transistor M1 in DAC slice b2), and a third bias DAC circuit (labeled "bias2" in FIG. 3) with an output coupled to gates of the bias transistors for bits 3 and 4 in the binary-weighted-bit DAC slices and for the 3 thermometer-encoded DAC slices (e.g., transistor M1 in DAC slices b3, b4, t0, t1, and t2). According to certain aspects, the first bias DAC circuit (bias0) may be a 7-bit bias DAC circuit, whereas the second bias DAC circuit (bias1) and the third bias DAC circuit (bias2) may each include a 9-bit bias DAC circuit.

The retimer and pulse generator circuits 330 may generally include a retimer and a pulse generator. The retimer may be used to align input data in a fixed sequence. In some examples, the pulse generator may have a plurality of inputs (e.g., a 4-bit parallel input) coupled to a plurality of outputs of the retimer. The pulse generator may also have a plurality of outputs coupled to the plurality of control inputs 212 of the MUXing stage 204 in each of the plurality of DAC slices 202. The pulse generator may be a one unit interval (1 UI) pulse generator (PG), as illustrated in FIG. 3, and may be used to generate multiple sequential pulses from the input data received from the retimer, each pulse having a width of one unit interval and offset from one another by one unit interval. For example, the 1 UI PG may take a 4-bit parallel input and generate four sequential pulses, each having a width of one unit interval and spanning a total time length of four unit intervals.

The transmit driver circuit 300 also depicts example components of the ESD protection and termination circuit 206 and the optional power switches 210. For example, as shown, the ESD protection and termination circuit 206 may include a tunable resistor Rterm, a plurality of inductive elements L1-L3, and ESD diodes 340. The inductive elements L1-L3 may be used to isolate parasitics of the ESD diodes 340. The optional power switches 210 include two p-type transistors M2 and M3 for selecting between different power supply rails (in this example, labeled "AVTT" and "AVCCAUX").

It may be appreciated that the transmit driver (circuits) 200 and 300 each depict a half circuit of a differential output transmit driver circuit. It may also be appreciated that the transmit driver (circuits) 200 and 300 may each be a tail-less current-mode logic driver circuit, and the plurality of DAC slices 202 may be binary-weighted slices that correspond to different current values.

Figure 4:
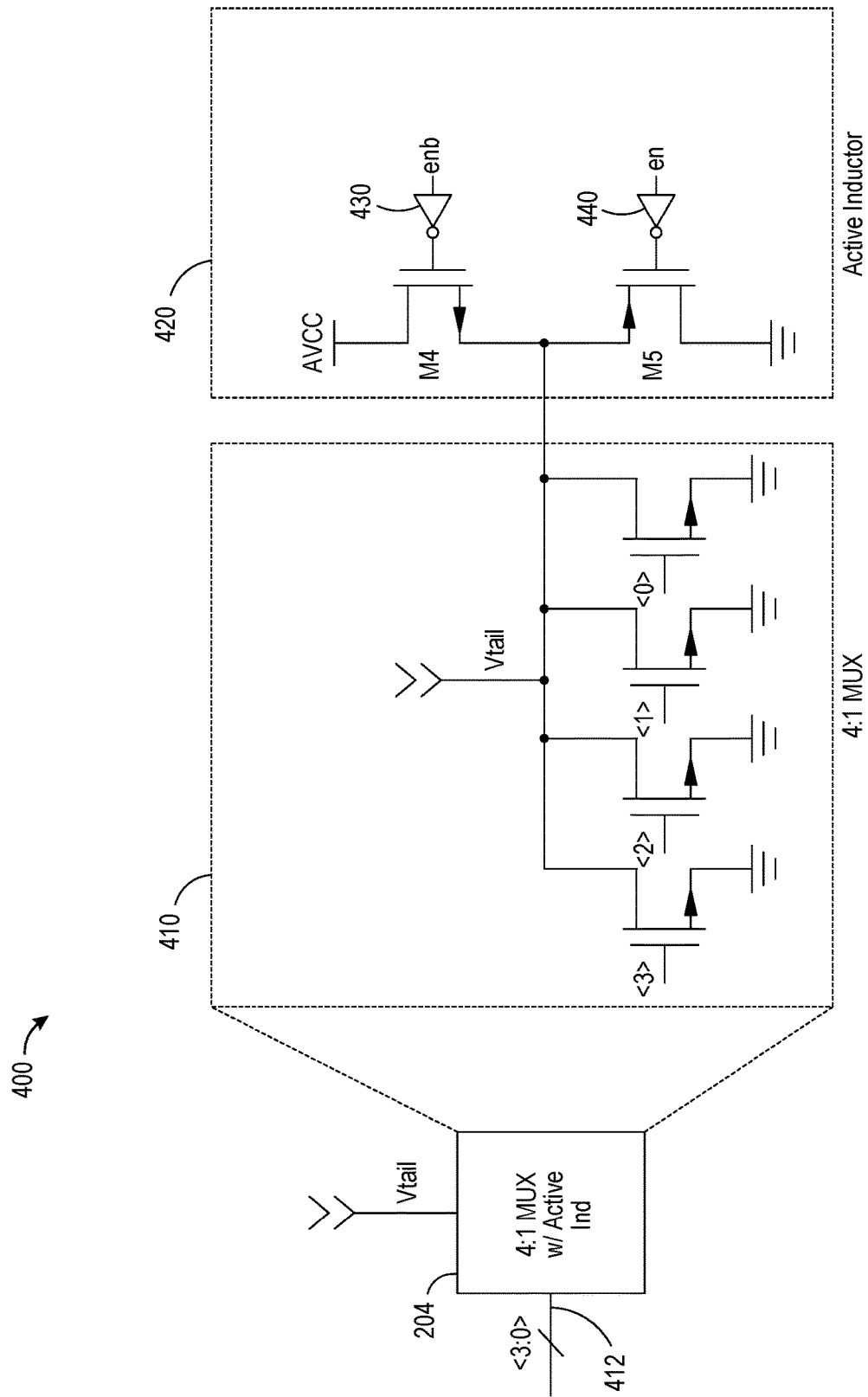
FIG. 4 is a circuit diagram illustrating an example multiplexing stage with an active inductor circuit, according to certain aspects of the present disclosure.

FIG. 4 is a circuit diagram illustrating an example implementation of a MUXing stage 400 with an active inductor, according to certain aspects of the present disclosure. The MUXing stage 400 of FIG. 4 may serve as the MUXing stage 204 in FIGS. 2 and 3. As shown, the MUXing stage 400 may include a 4:1 MUX 410 and an active inductor 420. While FIG. 4 illustrates a 4:1 MUX, it should be appreciated that the MUXing stage 400 may include a MUX with any suitable number of inputs.

According to certain aspects, the MUXing stage 400 may have a 4-bit input 412 (e.g., pulses from a pulse generator, as described above). As shown, the 4:1 MUX 410 may include four n-type transistors, each transistor functioning as a switch. In certain aspects, each bit of the 4-bit input may be input into a gate of one of the four n-type transistors. As shown, each of the n-type transistors may have a drain coupled to the output (Vtail) of the MUXing stage 400 and a source coupled to a reference potential node (e.g., electrical ground) for the MUXing stage. The pulses are used to drive the control inputs for the switches in the MUXing stage 204, thereby enabling or disabling each DAC slice dynamically and steering current between p and n branches of the differential pair. In other words, the four n-type transistors function as a 4:1 MUX to serialize the 4-bit parallel data at the output Vtail.

Additionally, each drain of the n-type transistors may also be coupled to a terminal of the active inductor 420. The active inductor 420 may include a pull-up transistor M4 with a drain coupled to a power supply rail (labeled "AVCC" in FIG. 4) and a source coupled to the terminal of the active inductor 420. In certain aspects, the pull-up transistor M4 may be an n-type transistor, as shown in FIG. 4. The active inductor 420 may also include a pull-down transistor M5 with a source coupled to the terminal of the active inductor 420 and a drain coupled to a reference potential node. In certain aspects, the pull-down transistor M5 may be a p-type transistor, as depicted in FIG. 4.

The active inductor 420 may also include a first inverter 430 and a second inverter 440. The first inverter 430 may have an output coupled to a gate of the pull-up transistor M4, and the second inverter 440 may have an output coupled to a gate of the pull-down transistor M5. According to certain aspects, an input (labeled "en" in FIG. 4) of the second inverter 440 may be configured to receive an enable signal for the active inductor 420, and an input (labeled "enb" in FIG. 4) of the first inverter 430 may be configured to receive a complement of the enable signal for the active inductor 420.

According to certain aspects, the active inductor 420 may serve to improve the bandwidth of the MUXing stage output (Vtail). The active inductor 420 may also balance the pull-up and pull-down edge rate at the MUXing stage output (Vtail). By balancing the pull-up and pull-down edge rates, the active inductor 420 may reduce the output common-mode ripple.

Example Transmit Driver Operations

FIG. 5 is a flow diagram of example operations 500 for driving data, according to certain aspects of the present disclosure. The operations 500 may be performed by a transmit driver circuit (e.g., the transmit driver 200 or the transmit driver circuit 300).

The operations 500 may begin, at block 502, by selectively enabling a plurality of digital-to-analog converter (DAC) slices (e.g., DAC slices 202) of the transmit driver circuit. According to some examples, the plurality of DAC slices correspond to different current values, and the selectively enabling may steer a corresponding current from enabled DAC slices to an output node (e.g., the Vdrv node, or the TXP or TXN node) of the transmit driver circuit. Each DAC slice may have an output coupled to the output node of the transmit driver circuit, and may generally include a bias transistor (e.g., transistor M1) having a drain coupled to the output of the DAC slice, and a multiplexer (e.g., MUXing stage 204) having a plurality of control inputs (e.g., control inputs 212) and an output coupled to a source of the bias transistor.

At optional block 504, the transmit driver circuit may optionally activate an active inductor (e.g., active inductor 420) in each DAC slice. In this case, the active inductor may have a terminal coupled to the output of the multiplexer in each DAC slice. For some examples, the active inductor includes a pull-up transistor (e.g., transistor M4) having a drain coupled to a power supply rail and having a source coupled to the terminal of the active inductor, a pull-down transistor (e.g., transistor M5) having a source coupled to the terminal of the active inductor and having a drain coupled to a reference potential node. The active inductor may also include a first inverter (e.g., inverter 430) having an output coupled to a gate of the pull-up transistor, and a second inverter (e.g., inverter 440) having an output coupled to a gate of the pull-down transistor. According to some examples, activating the active inductor may involve asserting an enable signal (e.g., en) on an input of the second inverter and deasserting a complement of the enable signal (e.g., enb) on an input of the first inverter.

According to some examples, the operations 500 may optionally involve driving the plurality of control inputs of the multiplexer in each DAC slice with a pulse generator (e.g., pulse generator in the retimer and pulse generator circuit 330) in each DAC slice at optional block 506. For certain aspects, the driving may involve the pulse generator receiving a multi-bit parallel input, generating a plurality of staggered pulses based on the mufti-bit parallel input, one pulse per bit, and sending the plurality of staggered pulses to the plurality of control inputs of the multiplexer. In this case, each of the pulses may have a width of one unit interval and may be offset from one another in time by one unit interval.

According to some examples, the operations 500 may optionally involve biasing the bias transistors of the plurality of DAC slices with a plurality of bias DAC circuits (e.g., bias DAC circuits 320) at optional block 508. In this case, an output of each bias DAC circuit may be coupled to a gate of the bias transistor in at least one of the DAC slices.

Example Programmable Integrated Circuits

The transmit driver architecture described herein may be implemented in the transmit driver of a serializer/deserializer (SerDes) system, for example. A SerDes transmitter (e.g., SerDes transmitter 104) may be included in any of various suitable devices or systems, such as an integrated circuit (IC) or module.

One type of IC that may utilize one or more SerDes transmit drivers (e.g., SerDes transmitter 104) is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

FIG. 6 is a block diagram illustrating an example architecture 600 for a programmable device. The architecture 600 may be implemented within a field programmable gate array (FPGA), for example. As shown, the architecture 600 includes several different types of programmable circuitry (e.g., logic blocks). For example, the architecture 600 may include a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized I/O blocks 607 (e.g., configuration ports and clock ports), and other programmable logic 608, such as digital clock managers, analog-to-digital converters (ADCs), system monitoring logic, and the like.

In some FPGAs, each programmable tile includes a programmable interconnect element (INT) 611 having standardized connections to and from a corresponding INT 611 in each adjacent tile. Therefore, the INTs 611, taken together, implement the programmable interconnect structure for the illustrated FPGA. Each INT 611 also includes the connections to and from the programmable logic element within the same tile, as shown by the examples included at the far tight of FIG. 6.

For example, a CLB 602 may include a configurable logic element (CLE) 612 that can be programmed to implement user logic plus a single INT 611. A BRAM 603 may include a BRAM logic element (BRL) 613 in addition to one or more INTs 611. Typically, the number of INTs 611 included in a tile depends on the width of the tile. In the pictured example, a BRAM tile has the same width as five CLBs, but other numbers (e.g., four) can also be used. A DSP block 606 may include a DSP logic element (DSPL) 614 in addition to an appropriate number of INTs 611. An IOB 604 may include, for example, two instances of an I/O logic element (IOL) 615 in addition to one instance of an INT 611. As will be clear to a person having ordinary skill in the art, the actual I/O pads connected, for example, to the IOL 615 typically are not confined to the area of the IOL 615.

In the example architecture 600 depicted in FIG. 6, a horizontal area near the center of the die (shown shaded in FIG. 6) is used for configuration, clock, and other control logic (CONFIG/CLOCKS 605). Other vertical areas 609 extending from this central area may be used to distribute the clocks and configuration signals across the breadth of the FPGA.

Some FPGAs utilizing the architecture 600 illustrated in FIG. 6 include additional logic blocks that disrupt the regular row structure making up a large part of the FPGA. The additional logic blocks may be programmable blocks and/or dedicated circuitry. For example, a processor block depicted as PROC 610 spans several rows of CLBs 602 and BRAMs 603.

The PROC 610 may be implemented as a hard-wired processor that is fabricated as part of the die that implements the programmable circuitry of the FPGA. The PROC 610 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 610 may include one or more cores (e.g., central processing units), cache memories, a memory controller, unidirectional and/or bidirectional interfaces configurable to couple directly to I/O pins (e.g., 110 pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 6 that are external to the PROC 610 may be considered part of the, or the, programmable circuitry of the FPGA.

FIG. 6 is intended to illustrate an example architecture 600 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 6 are exemplary. In an actual FPGA, for example, more than one adjacent row of CLBs 602 is typically included wherever the CLBs appear, in an effort to facilitate the efficient implementation of a user circuit design. The number of adjacent CLB rows, however, can vary with the overall size of the FPGA. Further, the size and/or positioning of the PROC 610 within the FPGA is for purposes of illustration only and is not intended as a limitation of the one or more examples of the present disclosure.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various processes in methods described above may be performed by any suitable means capable of performing the corresponding process functions. Such means may include various hardware and/or software component(s) and/or module(s), including, but not limited to a circuit, a field-programmable gate array (FPGA) or other programmable logic, an application-specific integrated circuit (ASIC), or a processor. Generally, where there are operations illustrated in figures, those operations may have corresponding counterpart means-plus-function components with similar numbering.

In the preceding, reference is made to aspects presented in this disclosure. However, the scope of the present disclosure is not limited to specific described aspects. Instead, any combination of the described features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim. In other words, other and further examples may be devised without departing from the basic scope of the present disclosure, and the scope thereof is determined by the claims that follow.

What is claimed is:

1. A transmit driver circuit, comprising:
   a voltage driver node;
   a plurality of digital-to-analog converter (DAC) slices, each DAC slice comprising:
   a multiplexer configured to serialize inputs to the multiplexer; and
   a bias transistor coupled between an output node of the multiplexer and the voltage driver node; and
   a plurality of bias DAC circuits comprising respective tunable current sources, replica bias transistors, and replica multiplexers, configured to control the bias transistors of respective subsets of the DAC slices.

2. The transmit driver circuit of claim 1, wherein:
   a drain of the bias transistor is coupled to the voltage driver node;
   a source of the bias transistor is coupled to the output node of the multiplexer; and
   a gate of the bias transistor is controlled by an output of a first one of the bias DAC circuits.

3. The transmit driver circuit of claim 1, wherein:
   the transmit driver circuit further comprises an electrostatic discharge circuit coupled to the voltage driver node;
   the DAC slices further comprise respective active inductors coupled to the output nodes of the respective multiplexers; and
   a first one of the active inductors comprises,
   a pull-up transistor configured to pull-up the output node of the respective multiplexer toward a supply voltage based on a first enable signal, and
   a pull-down transistor configured to pull-down the output node of the respective multiplexer toward a reference voltage based on a second enable signal.

4. The transmit driver circuit of claim 1, wherein:
   the transmit driver circuit further comprises an electrostatic discharge circuit coupled to the voltage driver node; and
   the DAC slices further comprise transistor-based active inductors coupled to the output nodes of the respective multiplexers, wherein the active inductors are configured to control pull-up and pull-down edge rates of the output nodes of respective ones of the multiplexers.

5. The transmit driver circuit of claim 1, wherein:
   the transmit driver circuit further comprises an electrostatic discharge circuit coupled to the voltage driver node; and
   the DAC slices further comprise transistor-based active inductors coupled to the output nodes of the respective multiplexers, wherein the active inductors are configured to increase a bandwidth of respective ones of the multiplexers.

6. The transmit driver circuit of claim 1, wherein:
   the transmit driver circuit further comprises an electrostatic discharge circuit coupled to the voltage driver node;
   the DAC slices further comprise transistor-based active inductors coupled to the output nodes of the respective multiplexers; and the bias DAC circuits further comprise respective replica active inductors.

7. The transmit driver circuit of claim 1, wherein:
a first subset of the DAC slices are configured as binary-weighted-bit DAC slices;
a second subset of the DAC slices are configured as thermometer-encoded DAC slices;
an output of a first one of the bias DAC circuits is coupled to a gate of the bias transistor of one or more of the binary-weighted-bit DAC slices; and
an output of a second one of the bias DAC circuits is coupled to a gate of the bias transistor of one or more of the thermometer-encoded DAC slices.

8. The transmit driver circuit of claim 1, wherein the transmit driver circuit comprises a 7-bit transmit driver circuit, and wherein the plurality of DAC slices comprises five binary-weighted-bit DAC slices and 3 three thermometer-encoded DAC slices.

9. The transmit driver circuit of claim 8, wherein:
an output of a first one of the bias DAC circuits is coupled to gates of the bias transistors for bits 0 and 1 of the binary-weighted-bit DAC slices;
an output of a second one of the bias DAC circuits is coupled to a gate of the bias transistor for bit 2 of the binary-weighted-bit DAC slices; and
an output of a third one of the bias DAC circuits is coupled to gates of the bias transistors for bits 3 and 4 of the binary-weighted-bit DAC slices and for the thermometer-encoded DAC slices.

10. The transmit driver circuit of claim 9, wherein the first bias DAC circuit comprises a 7-bit bias DAC circuit, wherein the second bias DAC circuit comprises a first 9-bit bias DAC circuit, and wherein the third bias DAC circuit comprises a second 9-bit bias DAC circuit.

11. The transmit driver circuit of claim 1, wherein the multiplexer in each DAC slice comprises a 4:1 multiplexer.

12. The transmit driver circuit of claim 1, wherein the transmit driver circuit comprises a tail-less current-mode logic driver circuit and wherein the plurality of DAC slices correspond to different current values.

13. A programmable integrated circuit (IC) device comprising:
a field programmable logic array (FPGA) comprising a plurality of gigabit transceivers that comprise respective transmitters configured to serialize data and transmit the serialized data over respective communication links, wherein a first one of the transmitters comprises a transmit driver circuit, and wherein:
the transmit driver circuit comprises a plurality of digital-to-analog converter (DAC) slices and a plurality of bias DAC circuits configured to provide bias voltages to the DAC slices,
each DAC slice comprises a multiplexer configured to serialize inputs to the multiplexer, and a bias transistor coupled between an output node of the multiplexer and a voltage driver node;
the bias DAC circuits comprise respective tunable current sources, replica bias transistors, and replica multiplexers; and
outputs of the bias DAC circuits are coupled to gates of the bias transistors of respective subsets of the DAC slices.

14. The programmable IC device of claim 13, wherein:
the transmit driver circuit further comprises an electrostatic discharge circuit coupled to the voltage driver node;
the DAC slices further comprise respective active inductors coupled to the output nodes of the respective multiplexers; and
a first one of the active inductors comprises,
a pull-up transistor configured to pull-up the output node of the respective multiplexer toward a supply voltage based on a first enable signal, and
a pull-down transistor configured to pull-down the output of the respective multiplexer toward a reference voltage based on a second enable signal.

15. The programmable IC device of claim 13, wherein:
the transmit driver circuit further comprises an electrostatic discharge circuit coupled to the voltage driver node; and
the DAC slices further comprise transistor-based active inductors coupled to the output nodes of the respective multiplexers, wherein the active inductors are configured to control pull-up and pull-down edge rates of the outputs of respective ones of the multiplexers.

16. The programmable IC device of claim 13, wherein:
the transmit driver circuit further comprises an electrostatic discharge circuit coupled to the voltage driver node; and
the DAC slices further comprise transistor-based active inductors coupled to the output nodes of the respective multiplexers, wherein the active inductors are configured to increase a bandwidth of respective ones of the multiplexers.

17. The programmable IC device of claim 13, wherein:
the transmit driver circuit further comprises an electrostatic discharge circuit coupled to the voltage driver node;
the DAC slices further comprise respective transistor-based active inductors coupled to the output nodes of the respective multiplexers; and
the bias DAC circuits further comprise respective replica active inductors.

18. The programmable IC device of claim 13, wherein the transmit driver circuit comprises a 7-bit transmit driver circuit, and wherein the plurality of DAC slices comprises five binary-weighted-bit DAC slices and three thermometer-encoded DAC slices.

19. The programmable IC device of claim 13, wherein:
a drain of the bias transistor of a first one of the DAC slices is coupled to the voltage driver node;
a source of the bias transistor of the first DAC slice is coupled to the output node of the respective multiplexer; and
the gate of the bias transistor of the first DAC slice is controlled by the output of a first one of the bias DAC circuits.

20. The programmable IC device circuit of claim 13, wherein:
a first subset of the DAC slices are configured as binary-weighted-bit DAC slices;
a second subset of the DAC slices are configured as thermometer-encoded DAC slices;
the output of a first one of the bias DAC circuits is coupled to a gate of the bias transistor of one or more of the binary-weighted-bit DAC slices; and
the output of a second one of the bias DAC circuits is coupled to a gate of the bias transistor of one or more of the thermometer-encoded DAC slices.

* * * * *